(12) United States Patent
Hofmann et al.

(10) Patent No.: US 11,594,848 B2
(45) Date of Patent: Feb. 28, 2023

(54) CONNECTOR ASSEMBLY AND METHOD FOR MANUFACTURING A CONNECTOR ASSEMBLY

(71) Applicant: MD ELEKTRONIK GmbH, Waldkraiburg (DE)

(72) Inventors: Thomas Hofmann, Tacherting (DE); Thomas Halbig, Dietfurt (DE); Daniel Bock, Schoenberg (DE); Hermann Kefer, Altoetting (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 127 days.

(21) Appl. No.: 17/218,185

(22) Filed: Mar. 31, 2021

(65) Prior Publication Data
US 2021/0328391 A1 Oct. 21, 2021

(30) Foreign Application Priority Data
Apr. 15, 2020 (DE) .................. 10 2020 110 237.2

(51) Int. Cl.
*H05K 1/18* (2006.01)
*H01R 13/717* (2006.01)
(Continued)

(52) U.S. Cl.
CPC ....... *H01R 13/7175* (2013.01); *G02B 6/0038* (2013.01); *G02B 6/0088* (2013.01); *H01R 13/506* (2013.01); *H01R 43/205* (2013.01); *H05K 1/18* (2013.01); *H01R 13/6272* (2013.01); *H05K 2201/09163* (2013.01); *H05K 2201/10106* (2013.01); *H05K 2201/10189* (2013.01)

(58) Field of Classification Search
CPC .......................... H01R 13/7175; H01R 13/506; H01R 43/205; H01R 12/724; G02B 6/0038; G02B 6/0088; H05K 1/18; H05K 2201/10106; H05K 2201/10189
See application file for complete search history.

(56) References Cited

U.S. PATENT DOCUMENTS 8,303,333 B2   2/2012 Lee
10,535,961 B2 *  1/2020 Cote .................. F21L 4/02
(Continued)

FOREIGN PATENT DOCUMENTS

DE   102018002124 A1   9/2019

*Primary Examiner* — Tho D Ta
(74) *Attorney, Agent, or Firm* — Leydig, Voit & Mayer, Ltd.

(57) ABSTRACT

A connector assembly for connecting a first electrical component to a second electrical component includes a circuit board which is electrically conductively connectable to the first electrical component. A plug unit is electrically conductively couplable, at a plug end, to a mating plug unit and is disposed on a first side of the circuit board. A light source is disposed on a second side of the circuit board opposite the first side. A light guide has an in-coupling region and an out-coupling region, and a through-hole in which the plug end of the plug unit is at least partially disposed. The light guide also has a light injection opening in which the light source is at least partially disposed. The in-coupling region is disposed on a side wall of the light injection opening, and the out-coupling region surrounds the through-hole.

19 Claims, 2 Drawing Sheets

(51) Int. Cl.
    *F21V 8/00*     (2006.01)
    *H01R 43/20*     (2006.01)
    *H01R 13/506*     (2006.01)
    *H01R 13/627*     (2006.01)

(56) References Cited

U.S. PATENT DOCUMENTS

| | | | |
|---|---|---|---|
| 10,811,805 B2 * | 10/2020 | Yamanaka | H05K 5/0069 |
| 2006/0063401 A1 * | 3/2006 | Ariga | H01R 12/7023 |
| | | | 439/76.1 |
| 2017/0133800 A1 | 5/2017 | Wu et al. | |

* cited by examiner

CONNECTOR ASSEMBLY AND METHOD FOR MANUFACTURING A CONNECTOR ASSEMBLY

CROSS-REFERENCE TO PRIOR APPLICATIONS

Priority is claimed to German Patent Application No. DE 10 2020 110 237.2, filed on Apr. 15, 2020, the entire disclosure of which is hereby incorporated by reference herein.

FIELD

The invention relates to a connector assembly for connecting a first electrical component to a second electrical component. The invention also relates to a method for manufacturing such a connector assembly.

BACKGROUND

Today, due to the extensive use of electrical and particularly electronic devices, there is a great need for interfaces that allow interconnection of electrical and electronic devices. Frequently used interfaces are plug connections via which the respective device can be coupled, either directly or via an additional cable. However, such interfaces must satisfy high demands, in particular in the automobile interior. For example, it must be ensured that the passenger can easily find and use the interface both during the day and at night. Thus, the interface must have convenient ergonomics and good visibility, making it readily and quickly perceptible to the passenger. At the same time, however, the interior trim parts in which the interfaces are mounted usually provide little space for installation, so that the interface must be compact in design.

SUMMARY

In an embodiment, the present invention provides a connector assembly for connecting a first electrical component to a second electrical component. The connector assembly includes a circuit board which is electrically conductively connectable to the first electrical component. A plug unit is electrically conductively couplable, at a plug end, to a mating plug unit and is disposed on a first side of the circuit board. A light source is disposed on a second side of the circuit board opposite the first side. A light guide has an in-coupling region and an out-coupling region, and a through-hole in which the plug end of the plug unit is at least partially disposed. The light guide also has a light injection opening in which the light source is at least partially disposed. The in-coupling region is disposed on a side wall of the light injection opening, and the out-coupling region surrounds the through-hole.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
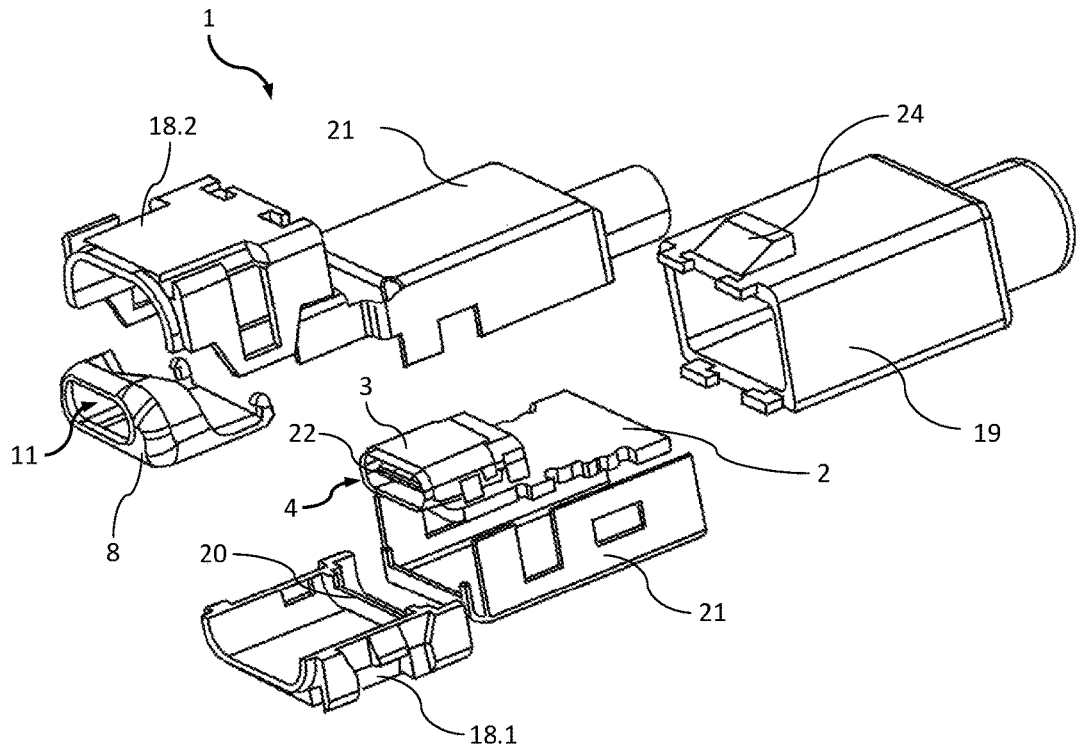
FIG. 1 shows a three-dimensional exploded view of a first embodiment of a connector assembly according to the invention.

In an embodiment, the present invention provides a plug connection that is readily perceptible and at the same time is compact and simple in design. In another embodiment, the present invention is to provide a method for manufacturing such a plug connection.

A connector assembly according to an embodiment of the invention is suitable for connecting, in particular releasably connecting, a first electrical component to a second electrical component. The electrical component may be, for example, a cable or an electrical device. The connection allows the electrical components to be electrically conductively connected so that a current flow, a signal communication and/or a data communication are/is established between the first and second components. The connector assembly according to an embodiment of the invention includes a circuit board which is electrically conductively connectable to the first component. The first electrical component may be in the form of, for example, a single- or multi-wire cable, whose conductors may, for example, be soldered to the circuit board. Moreover, the connector assembly includes a plug unit which is electrically conductively couplable, at a plug end, to a mating plug unit. The plug unit is disposed on a first side of the circuit board. The plug unit is preferably electrically conductively connected to conductive traces of the circuit board. The plug end may be understood to be the end of the plug unit where the plug unit is couplable to a mating plug unit. Therefore, the plug unit preferably has one or more plug contacts at the plug end.

A light source is disposed on a second side of the circuit board. The second side is opposite the first side of the circuit board. Preferably, the second side extends parallel to the first side. The light source is preferably a point light source, for example, in the form of a light-emitting diode. Furthermore, the light source may be a monochromatic or a polychromatic light-emitting diode. The light source is preferably controllable via the circuit board. Particularly preferably, the light source is disposed opposite the plug unit on the second side of the circuit board. The plug assembly according to an embodiment of the invention further includes a light guide having an in-coupling region and an out-coupling region. An in-coupling region may be understood here to be a region of the light guide where light, which is preferably emitted by the light source, is intended to be introduced into the light guide. An out-coupling region may be understood in this context to be a region of the light guide where the light present in the light guide is intended to exit the light guide. The light guide is preferably composed of a light-conducting material, such as, for example, polycarbonate (PC) or polymethyl methacrylate (PMMA). Furthermore, the light guide may include diffusing elements. The light guide has a through-hole in which at least the plug end of the plug unit is at least partially disposed. The through-hole may have a shape that matches the outer shape of the plug unit in the region of the plug end, so that the light guide is located as closely adjacent to the plug unit as possible when the plug unit is disposed in the through-hole. The light guide further has a light injection opening in which the light source is at least partially disposed. The light injection opening is preferably located on a side of the light guide that forms an angle of from 60 to 120 degrees with a side where the through-hole is located. The light injection opening is preferably configured as a through-extending opening. The in-coupling region is provided on a side wall of the light injection opening. The light source is preferably disposed such that a main direction of emission of light from the light source is toward the side wall of the light injection opening that has the in-coupling region. The out-coupling region surrounds the through-hole. Preferably, the out-coupling region surrounds the through-hole in the form of a closed ring or band.

The design according to an embodiment of the invention makes it possible to provide a connector assembly which not only allows for easy connection of a first electrical component to a second electrical component. It is also possible to provide a connector assembly which is readily perceptible by the user. At the same time, the connector assembly remains compact and thus inexpensive in design. In addition, by disposing the in-coupling region in a side wall of the light injection opening, it is possible to provide for a backlighting of the out-coupling region that is free of light spots and capable of providing a particularly homogeneous light image.

The light guide may have at least one latching hook by which the light guide is secured to the circuit board. The latching hook preferably serves to preliminarily secure the light guide to the circuit board to facilitate subsequent processing of the circuit board with the light guide positioned thereon. The latching hook is preferably disposed in an edge portion of the light guide opposite a portion in which the through-hole is located, so that the latching hook does not adversely affect the propagation of light in the light guide from the in-coupling region to the out-coupling region. Preferably, the latching hook is formed of the same material as the light guide.

The out-coupling region may be configured as a linear ridge. Particularly preferably, the out-coupling region is configured as a bead which, even more preferably, surrounds the through-hole in contiguous relation thereto. Particularly preferably, the ridge surrounds the through-hole as a closed line or band.

The light guide may have an out-coupling structure in the out-coupling region and/or an in-coupling structure in the in-coupling region. The out-coupling structure and/or the in-coupling structure may be in the form of, for example, a surface texture, such as grain, in the out-coupling region and/or in the in-coupling region. Alternatively or additionally, the light guide may have geometric elements, such as, for example, one or more prisms, in the out-coupling region and/or in the in-coupling region, the geometric elements promoting the in-coupling and/or out-coupling of light.

The light source may have a main direction of emission which differs from a plugging direction of the plug unit. The main direction of emission may be oriented, for example, at a right angle or at an obtuse angle to the plugging direction. Particularly preferably, the main direction of emission is opposite to the plugging direction. In this context, the main direction of emission may be understood to be the direction of light emission of the light source in which the light source emits the largest part of its light. In this context, the plugging direction may be understood to be the direction in which the plug unit would have to be moved in order to connect it to a mating plug unit.

It is particularly advantageous if the plugging direction of the plug unit is parallel to the circuit board. This may be achieved, for example, by configuring the plug unit as an angle plug. The plugging direction is preferably horizontal to a main plane defined by the largest surface of the circuit board. Particularly preferably, the plugging direction is parallel to the main plane of the circuit board. Furthermore, it is preferred that the main plane be formed by the first side and/or the second side of the circuit board.

At least the light guide may be enclosed by a first housing portion, and at least the circuit board may be enclosed by a second housing portion. It is preferred in this connection that at least the first housing portion and the second housing portion form a common housing. The first housing portion is preferably of multi-piece construction and is preferably formed by two housing portion elements which are connected together. Connection of the housing portion elements is preferably accomplished by latching or adhesively bonding them together. The housing portion elements preferably have a first connecting plane which extends parallel to the main plane of the circuit board. In contrast, the second housing portion may be of single-piece construction. The first housing portion may be connected to the second housing portion. The first and second housing portions may be joined at a second connecting plane which extends perpendicular to the main plane of the circuit board. The second housing portion may be injection-molded onto the first housing portion, and the circuit board may be at least partially overmolded by the second housing portion.

The first housing portion may have at least one positioning element which secures the light guide and/or retains it in position. The positioning element may be configured, for example, as a pin, as a surface, or as a rib which is disposed on a side of the first housing portion facing the light guide. The positioning element may secure the light guide and retain it in position, for example, by a friction fit.

The circuit board and/or the plug unit may be at least partially disposed within a shield. The shield is preferably made of an electrically conductive material such as, for example, metal. The shield may have an opening through which the first electrical component may be passed to the circuit board. Preferably, the shield is disposed between the plug unit and/or the circuit board and the two housing portions. If the first housing portion and/or the second housing portion are/is produced by overmolding the circuit board, a portion of the injection-molded material that forms the respective housing portion may be disposed between the circuit board and the shield so that the shield is at least partially embedded in the injection-molded material of the housing portion.

In addition to the inventive connector assembly, an embodiment of the invention also provides a method for manufacturing such an inventive connector assembly. The method according to an embodiment of the invention includes at least the step of disposing the plug unit on a first side of the circuit board. Preferably, the plug unit is electrically conductively connected, preferably permanently, to conductive traces of the circuit board. The method further includes the step of disposing a light source on a second side of the circuit board which is opposite the first side. It is preferred here that the first side and the second side be parallel to each other, and even more preferably that the first and second sides form the largest sides of the circuit board. The light source is preferably also electrically conductively connected to conductive traces of the circuit board, so that the light source is preferably controllable via the circuit board. The disposition of the plug unit and the light source on the circuit board is followed by a step of slipping a light guide onto the plug end of the plug unit, the light guide having a through-hole into which the plug unit is at least partially inserted at least with the plug end. Slipping of the light guide onto the plug unit is preferably performed parallel to the plugging direction of the plug unit. The light guide is slipped onto the plug unit in such a way that the plug unit extends at least partially into the through-hole. The method further includes disposing the light guide around the light source, the light guide having a light injection opening into which the light source is at least partially inserted. The disposition of the light guide around the light source is preferably performed subsequent to the step of slipping the light guide onto the plug unit. Preferably, the disposition of the light guide around the light source is performed by pivoting the light guide.

Subsequent to the step of disposing the light guide around the light source on the circuit board, the light guide may be secured, in particular releasably secured, to the circuit board. The light guide may have at least one latching hook for this purpose. The circuit board may have at least one recess, so that the latching hook can latch into the recess on the circuit board.

It is especially advantageous if the slipping of the light guide onto the plug unit is performed prior to disposing the light guide around the light source. Once slipped onto plug unit, the light guide is already retained in two dimensions by the plug. This facilitates alignment relative to the light guide. In this connection, it is particularly advantageous to secure the light guide to the circuit board, for example, by means of the latching hook, after the light guide has been disposed around light source.

Subsequent to slipping the light guide onto the plug unit and disposing the light guide around the light source, a first housing portion may be disposed at least partially around the light guide, which housing portion secures the light guide to the circuit board. The first housing portion may be formed by two housing portion elements which are connected together while the light guide is disposed between the housing portion elements. The connection between the housing portion elements is preferably accomplished by a snap-fit connection.

It is especially advantageous if the placement of the first housing portion is followed by disposing a second housing portion at least around the circuit board. Particularly preferably, the second housing portion is produced by overmolding. To this end, the second housing portion may be injection-molded onto the first housing portion.

Embodiments of the invention have been described with a connector assembly and a method for manufacturing such a connector assembly. The explanations given with respect to the connector assembly also apply to the method, and the explanations given with respect to the method also apply to the connector assembly, unless they contradict one another.

FIG. 1 shows, in three-dimensional exploded view, a first embodiment of a connector assembly 1 according to the invention. Connector assembly 1 has a circuit board 2 having a plug unit 3 disposed thereon. Plug unit 3 is an angle plug that is contacted to circuit board 2. Plug unit 3 is disposed on an edge portion of circuit board 2 so that a plug end 4 of plug unit 3 projects beyond circuit board 2. At plug end 4, plug unit 3 can be coupled to a mating plug unit. To this end, plug unit 3 is provided at plug end 4 with plug contacts 22 which can be electrically conductively connected to plug contacts of the mating plug unit. Connector assembly 1 further has a light guide 8 which is attachable to circuit board 2. Light guide 8 includes a through-hole 11 into which plug unit 3 is insertable with its plug end 4 so that plug unit 3 can be at least partially disposed with plug end 4 in through-hole 11.

In the present embodiment, circuit board 2 and plug unit 3 are enclosed by a two-part shield 21. In the present embodiment, shield 21 is made of metal and shields both circuit board 2 and plug unit 3 against electromagnetic influences from outside. In order to protect connector assembly 1 from external mechanical influences, it has a first housing portion 18 and a second housing portion 19. In the present embodiment, first housing portion 18 is made up of a first housing portion element 18.1 and a second housing portion element 18.2. The two housing portion elements 18.1, 18.2 are interlockingly connected together by a snap-fit connection. First housing portion 18 encloses light guide 8, plug unit 3, and circuit board 2. First housing portion element 18.1 has a positioning element 20 on a side facing light guide 8, the positioning element being used to secure light guide 8 in place on circuit board 2. Second housing portion 19 adjoins first housing portion 18 and encloses the remaining portions of circuit board 2, plug unit 3, and light guide 8. In the present embodiment, second housing portion 19 is of single-piece construction and manufactured in an injection-molding process. In order to allow connector assembly 1 to be mounted in an interior trim part of a vehicle, second housing portion 19 has a connecting hook 24.

Figure 2:
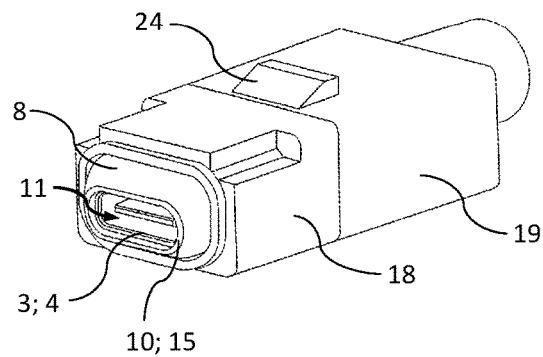
FIG. 2 shows a three-dimensional view of a second embodiment of a connector assembly according to the invention.

FIG. 2 shows, in three-dimensional view, a second embodiment of a connector assembly 1 according to the invention. In contrast to the first embodiment, first housing portion 18 and second housing portion 19 are of single-piece construction, second housing portion 19 also having a connecting hook 24. Light guide 8 is open at an end face of first housing portion 18 so that plug unit 3 can still be coupled at plug end 4 to a mating plug unit. Light guide 8 has a ridge 15 adjacent and surrounding opening 11. In the present embodiment, ridge 15 is configured as a closed line. Ridge 15 forms an out-coupling region 10 so that light coupled into light guide 8 is coupled out around through-hole 11. Furthermore, the ridge makes through-hole 11 haptically more perceptible.

Figure 3:
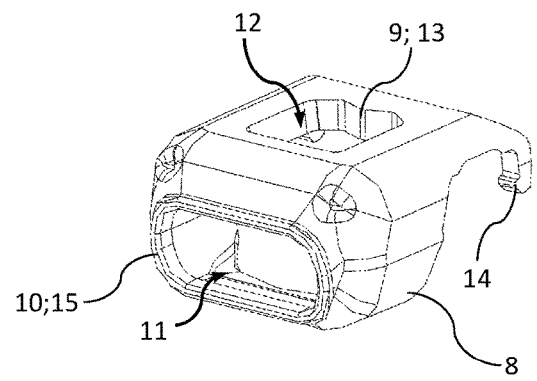
FIG. 3 shows an embodiment of a light guide of a connector assembly according to the invention.

FIG. 3 depicts an embodiment of a light guide 8 of a connector assembly 1 according to the invention. Light guide 8 is made of polymethyl methacrylate and has a light injection opening 12 in addition to through-hole 11. Light injection opening 12 has a direction of extent approximately perpendicular to the direction of extent of through-hole 11. Light guide 8 has an in-coupling region 9 on a side wall 13 of light injection opening 12. In-coupling region 9 essentially serves to couple light from a light source into light guide 8. Therefore, side wall 13 has a prismatic shape in in-coupling region 9. In-coupling region 9 is disposed on a side wall 13 of light injection opening 12 opposite through-hole 11. Due to the shape of light guide 8, the light coupled into light guide 8 is guided to out-coupling region 10, which is configured in the form of ridge 15 around through-hole 11.

Figure 4:
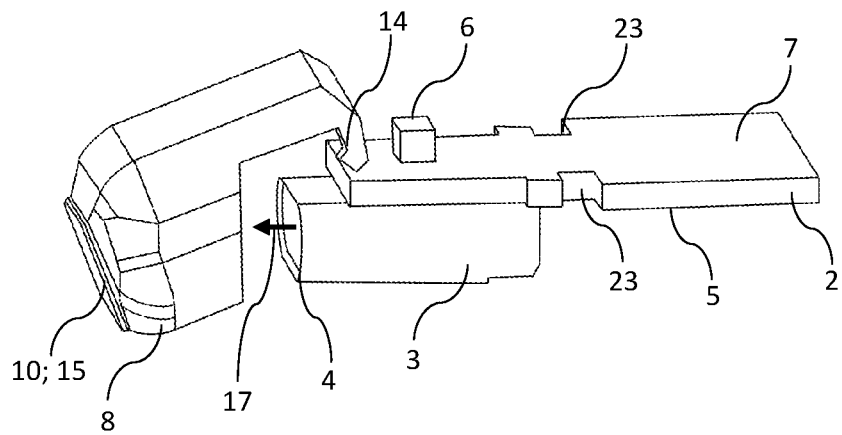
FIGS. 4 through 6 illustrate an embodiment of how a light guide is mounted to a circuit board of the inventive connector assembly.
Figure 5:
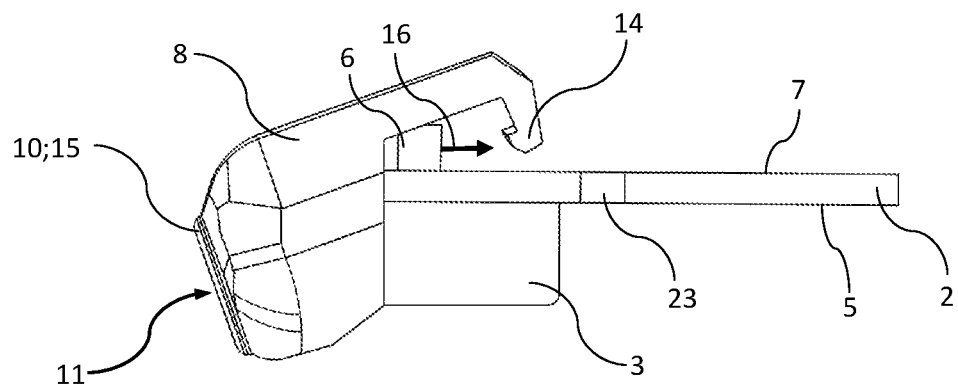
Figure 6:
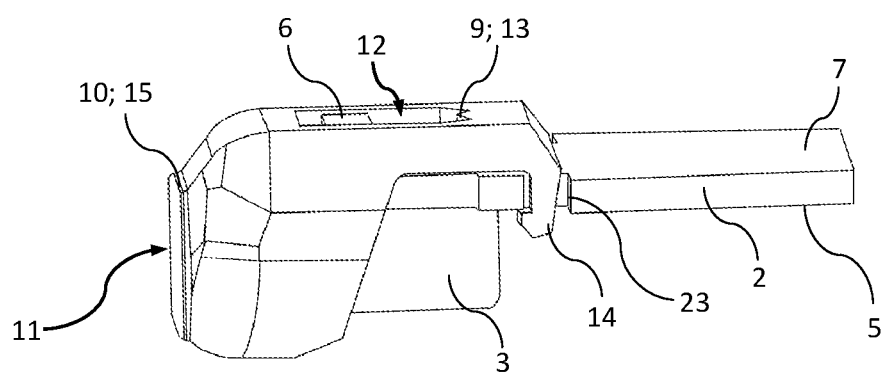

FIGS. 4 through 6 illustrate an embodiment of how light guide 8 is mounted to circuit board 2. In the embodiment shown, plug unit 3 is disposed on a first side 5 of circuit board 2. Furthermore, a light source 6 is disposed on circuit board 2 on a second side 7 opposite and parallel to first side 5. In the present embodiment, light source 6 takes the form of an RGB LED. Light guide 8 has two latching hooks 14 for attachment to circuit board 2, the latching hooks being capable of engaging in recesses 23 on circuit board 2. In order to attach light guide 8 to circuit board 2, initially light guide 8 is slipped onto plug unit 3 so that plug end 4 of plug unit 3 is disposed within through-hole 11. The shape of through-hole 11 is selected such that light guide 8 can still be tilted to a degree sufficient to allow latching hooks 14 to be moved past circuit board 2 and lockingly engaged within recesses 23. During latching engagement, light guide 8 is tilted in such a way that light source 6 is disposed within light injection opening 12 so that light injection opening 12 surrounds the light source.

In the embodiment shown, light source 6 has a main direction of emission 16 opposite to plugging direction 17 of plug unit 3. Therefore, in-coupling region 9 is disposed on a side wall 13 of light injection opening 12 opposite through-hole 11. The light emitted by light source 6 propagates along main direction of extension 16 onto in-coupling region 9 and enters light guide 8. Within light guide 8, the light is guided to out-coupling region 10, which, in the present embodiment, is formed by a ridge 15 surrounding through-hole 11. In the out-coupling region, the light contained in light guide 8 is coupled out in a defined and homogeneous manner. Ridge 15 is grained to promote the out-coupling of light. The guidance of light within light guide 8 is achieved by forming light guide 8 in a specific shape that causes the light to be totally internally reflected at the interface between light guide 8 and the surrounding air and thus guides the light in a low-loss manner to out-coupling region 10.

The explanations provided with regard to the figures are merely for the sake of illustration and are not to be construed as limiting.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 1 connector assembly
2 circuit board
3 plug unit
4 plug end
5 first side
6 light source
7 second side
8 light guide
9 in-coupling region
10 out-coupling region
11 through-hole
12 light injection opening
13 side wall
14 latching hook
15 ridge
16 main direction of emission
17 plugging direction
18 first housing portion
19 second housing portion
20 positioning element
21 shield
22 plug contacts
23 recess
24 connecting hook

What is claimed is:

1. A connector assembly for connecting a first electrical component to a second electrical component, the connector assembly comprising:
   a circuit board which is electrically conductively connectable to the first electrical component,
   a plug unit which is electrically conductively couplable, at a plug end, to a mating plug unit and is disposed on a first side of the circuit board,
   a light source which is disposed on a second side of the circuit board opposite the first side, and
   a light guide having an in-coupling region and an out-coupling region, the light guide having a through-hole in which the plug end of the plug unit is at least partially disposed, the light guide having a light injection opening in which the light source is at least partially disposed, the in-coupling region being disposed on a side wall of the light injection opening, and the out-coupling region surrounding the through-hole,
   wherein at least the light guide is enclosed by a first housing portion, and the circuit board is enclosed by a second housing portion.

2. The connector assembly as recited in claim 1, wherein the light guide has at least one latching hook by which the light guide is secured to the circuit board.

3. The connector assembly as recited in claim 1, wherein the out-coupling region is configured as a linear ridge.

4. The connector assembly as recited in claim 1, wherein the out-coupling region is configured as a bead.

5. The connector assembly as recited in claim 1, wherein the light guide has an out-coupling structure in the out-coupling region and/or an in-coupling structure in the in-coupling region.

6. The connector assembly as recited in claim 1, wherein the first housing portion is of multi-piece construction and/or the second housing portion is of single-piece construction.

7. The connector assembly as recited in claim 8claim 1, wherein the first housing portion has at least one positioning element which secures the light guide and/or retains the light guide in position.

8. The connector assembly as recited in claim 1, wherein the circuit board and/or the plug unit are/is at least partially disposed within a shield.

9. The connector assembly as recited in claim 1, wherein the light source has a main direction of emission which differs from a plugging direction of the plug unit.

10. The connector assembly as recited in claim 9, wherein the plugging direction is horizontal to the circuit board.

11. A method for manufacturing a connector assembly for connecting a first electrical component to a second electrical component, the method comprising:
    disposing a plug unit on a first side of a circuit board, the circuit board being electrically conductively connectable to the first electrical component and the plug unit being electrically conductively couplable, at a plug end, to a mating plug unit;
    disposing a light source on a second side of the circuit board opposite the first side;
    slipping a light guide onto the plug unit, the light guide having a through-hole into which the plug unit is at least partially inserted at least with the plug end;
    disposing the light guide around the light source, the light guide having a light injection opening into which the light source is at least partially inserted, the light guide having an in-coupling region disposed on a side wall of the light injection opening, and an out-coupling region surrounding the through-hole; and
    subsequent to disposing the light guide around the light source, releasably securing the light guide to the circuit board.

12. The method as recited in claim 11, wherein the slipping of the light guide onto the plug unit is performed prior to disposing the light guide around the light source.

13. The method as recited in claim 11, wherein, subsequent to slipping the light guide onto the plug unit and disposing the light guide around the light source, a first housing portion is disposed at least partially around the light guide and secures the light guide to the circuit board.

14. The method as recited in claim 13, wherein, subsequent to the placement of the first housing portion, a second housing portion is disposed at least partially around the circuit board.

15. The method as recited in claim 14, wherein the second housing portion is disposed at least partially around the circuit board by overmolding.

16. A method for manufacturing a connector assembly for connecting a first electrical component to a second electrical component, the method comprising:
    disposing a plug unit on a first side of a circuit board, the circuit board being electrically conductively connectable to the first electrical component and the plug unit being electrically conductively couplable, at a plug end, to a mating plug unit;
    disposing a light source on a second side of the circuit board opposite the first side;
    slipping a light guide onto the plug unit, the light guide having a through-hole into which the plug unit is at least partially inserted at least with the plug end; and
    subsequent to slipping the light guide onto the plug unit, disposing the light guide around the light source, the light guide having a light injection opening into which the light source is at least partially inserted, the light guide having an in-coupling region disposed on a side wall of the light injection opening, and an out-coupling region surrounding the through- hole.

17. The method as recited in claim 16, wherein, subsequent to slipping the light guide onto the plug unit and disposing the light guide around the light source, a first housing portion is disposed at least partially around the light guide and secures the light guide to the circuit board.

18. The method as recited in claim 17, wherein, subsequent to the placement of the first housing portion, a second housing portion is disposed at least partially around the circuit board.

19. The method as recited in claim 18, wherein the second housing portion is disposed at least partially around the circuit board by overmolding.

\* \* \* \* \*